United States Patent [19]

Otsu

[11] Patent Number: 5,236,861
[45] Date of Patent: Aug. 17, 1993

[54] MANUFACTURING METHOD OF METAL-INSULATOR-SEMICONDUCTOR DEVICE USING TRENCH ISOLATION TECHNIQUE

[75] Inventor: Takaji Otsu, Kanagawa, Japan
[73] Assignee: Sony Corporation, Tokyo, Japan
[21] Appl. No.: 926,395
[22] Filed: Aug. 10, 1992
[30] Foreign Application Priority Data Aug. 16, 1991 [JP] Japan .................. 3-205896

[51] Int. Cl.[5] ............................ H01L 21/76
[52] U.S. Cl. ........................ 437/67; 437/69
[58] Field of Search ............ 437/67, 69, 968; 148/DIG. 85, DIG. 86, DIG. 50, DIG. 117

[56] References Cited
FOREIGN PATENT DOCUMENTS 61-154144 7/1986 Japan .

OTHER PUBLICATIONS

Wolf, S., et al, *Silicon Processing for the VLSI Era*, vol. 2, 1990, pp. 51-58 & 419-426.

*Primary Examiner*—George Fourson
*Attorney, Agent, or Firm*—Hill, Steadman & Simpson

[57] ABSTRACT

A method of manufacturing a metal-insulator-semiconductor (MIS) device in which a gate electrode is formed to cover the upper portion of a device forming region which is isolated by a trench is comprised of a step of forming a laminated film including at least an oxidation proof film on a substrate, a step of selectively removing parts of the laminated film and a part of the substrate beneath the laminated film to thereby form a trench in the substrate, a step of burying an insulation film in the trench, and a step of performing a selective oxidation on the entire surface of the insulation film.

1 Claim, 5 Drawing Sheets

F/G. 1(PRIOR ART)
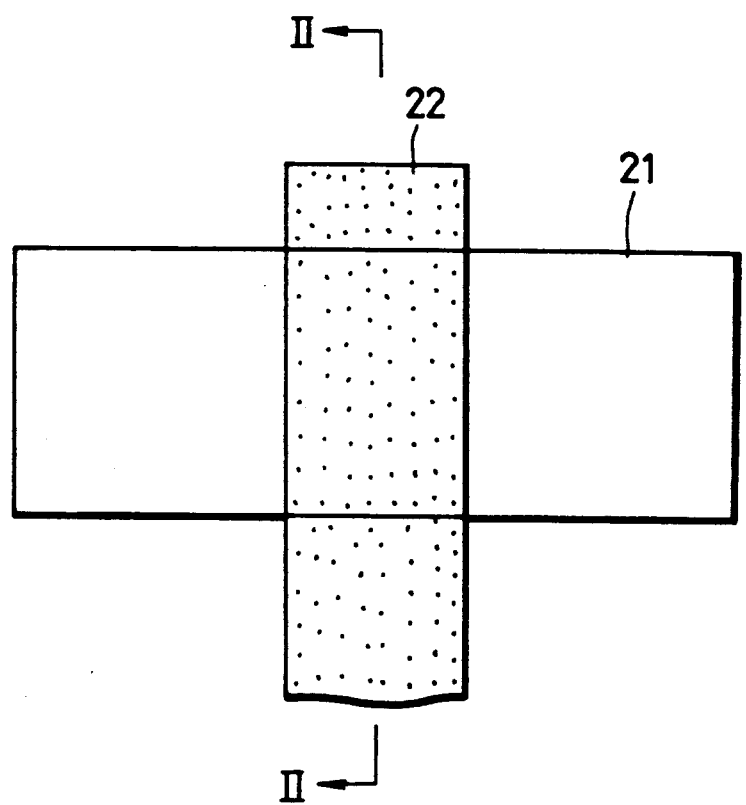

MANUFACTURING METHOD OF METAL-INSULATOR-SEMICONDUCTOR DEVICE USING TRENCH ISOLATION TECHNIQUE

BACKGROUND OF THE INVENTION

1. Field of the Invention

The present invention generally relates to manufacturing methods of a metal-insulator-semiconductor (MIS) device using trench isolation technique. More particularly, the present invention is directed to a method of manufacturing a MIS device such as a metal oxide semiconductor (MOS) type field effect transistor (FET) in which a gate electrode is formed to cover the upper portion of an element or device forming region which is isolated by a trench.

2. Description of the Prior Art

In general, there has been proposed a method of manufacturing such a MOS type FET as shown in FIG. 1 in which a gate electrode 22 is formed to cover the upper portion of an element or a device forming region which is isolated by a trench. A manufacturing process sequence for forming the MOS type FET shown in FIG. 1 will be explained with reference to FIGS. 2A to 2E which are sectional views of the MOS type FET taken along the line II—II in FIG. 1.

Referring to FIG. 2A, for example, portions of a p-type silicon substrate 23 serving as device isolation regions are partially etched away by the reactive ion etching (RIE) process, for example, thereby forming trenches 24. Portions of the p-type silicon substrate 23 other than the trenches 24 constitute an element or device forming region 21.

Thereafter, as shown in FIG. 2B, an SiO$_2$ film 25 is formed on the entire surface of the p-type silicon substrate 23 by the bias electron cyclotron resonance (ECR) plasma chemical vapour deposition (CVD) technique.

Then, after forming a flattening film such as SOG or BPSG on the entire surface of the SiO$_2$ film 25, the flattening film and the SiCO$_2$ film 25 are etched back by the RIE process, for example, to thereby flatten the SiO$_2$ film 25, as shown in FIG. 2C. This flattening process is continued until the device forming region 21 of the silicon substrate 23 is exposed. At this time, the SiO$_2$ film 25 is buried in the trenches 24. In this case, there is such a portion in which the upper surface of the SiO$_2$ film 25 is lower than the upper surface of the device forming region 21 of the silicon substrate 23 due to the scatterings of the etching back rate.

Next, as shown in FIG. 2D, the thermal oxidation process is carried out on the entire surface of the device forming region 21 and the SiO$_2$ film 25 to thereby form a gate insulation film 26 made of a thermal oxidation film on the exposed surface of the silicon substrate 23, that is, the upper surface of the device forming region 21.

Thereafter, as shown in FIG. 2E, a polycrystalline silicon layer is formed on the entire surface of both the SiO$_2$ film 25 and the gate insulation film 26, then the patterning process is carried out for the polycrystalline silicon layer to form a gate electrode 27, thereby providing a MOS type FET. In this case, the gate electrode 27 is formed to cover the upper portion of the device forming region 21.

However, in the conventional manufacturing method of a MOS type FET, after the SiO$_2$ film 25 has been buried in the trenches 24, the thermal oxidation process is carried out therefor so as to form the gate insulation film 26 of the thermal oxidation film on the exposed portion of the silicon substrate 23 (upper surface of the device forming region 21), so that the gate insulation film 26 becomes thinner in thickness at edge portions a of the device forming region 21 of the silicon substrate 23, as shown in FIG. 2E. In particular, the thickness of the gate insulation film 26 is quite thin at the edge portion thereof adjacent to the edge of the SiO$_2$ film 25 whose upper surface is lower than the upper surface of the device forming region 21 due to the scatterings of the etching back rate.

Further, in addition to the thin thickness of the gate insulation film 26, since the edge portions a of the device forming region 21 of the silicon substrate 23 are formed at substantially a right angle, the electrostatic concentration likely occurs at the edge portions a, thereby degrading or lowering a breakdown voltage of the gate electrode disadvantageously.

Furthermore, the stress is liable to be applied to the edge portions a during the manufacturing process of the MOS type FET, so that there appears lattice defect at the edge portions frequently. The lattice defect causes the faulty a leakage current, thereby degrading a yield of the MOS type FET remarkably.

OBJECTS AND SUMMARY OF THE INVENTION

It is an object of the present invention to provide an improved manufacturing method of a metal-insulator-semiconductor (MIS) device using the trench isolation technique in which the aforementioned shortcomings and disadvantages encountered with the prior art can be eliminated.

More specifically, it is an object of the present invention to provide a manufacturing method of a MIS device using the trench isolation technique which can not only increase or improve a gate breakdown voltage of the MIS device such as a MOS type FET which is isolated by the trench but also improve a faulty leakage current.

According to an aspect of the present invention, there is provided a method of manufacturing a metal-insulator-semiconductor (MIS) device in which a gate electrode is formed to cover the upper portion of a device forming region which is isolated by a trench is comprised of a step of forming a laminated film including at least an oxidation proof film on a substrate, a step of selectively removing parts of the laminated film and a part of the substrate beneath the laminated film to thereby form the trench in the substrate, a step of burying an insulation film in the trench, and a step of performing a selective oxidation on an entire surface of the insulation film.

According to a preferred embodiment of the manufacturing method of the present invention, a laminated film including at least an oxidation proof film is formed on a substrate, then parts of the laminated film and the substrate beneath the laminated film are selectively removed to thereby form a trench in the substrate. Thereafter, an insulation film is buried in the trench, and then the selective oxidation is carried out on the entire surface of the insulation film, so that the edge portions of element or device forming region of the substrate can be formed to be round, and after formation of a gate insulation film, the thickness of the gate insulation film at the edge portions of the device forming region can be made sufficiently large. As a result, the electrostatic concentration at the edge portions in an operating state of the MIS device can be reduced and so a breakdown voltage of the gate electrode can be improved.

Further, since the edge portions of the device forming region are made round, it has become possible to prevent the concentration of stress at the edge portions during the manufacturing process of the MIS device, so that lattice defect at the edge portions can be decreased. For this reason, the generation of a leakage current can be decreased, thereby improving a yield of the MIS device.

The preceding and other objects, features, and advantages of the present invention will become apparent from the following detailed description of an illustrative embodiment thereof when read in conjunction with the accompanying drawings.

BRIEF DESCRIPTION OF THE DRAWINGS

FIG. 1 is a schematic plan view showing an example of conventional MOS type FETs;

DESCRIPTION OF THE PREFERRED EMBODIMENT

An embodiment of the manufacturing method of a metal-insulator-semiconductor (MIS) device using the trench isolation technique according to the present invention will now be described with reference to FIGS. 3A to 3F, in which case the present invention is applied to a MOS type FET of any one of N channel and P channel types.

FIGS. 3A to 3F are sectional views showing a process sequence for forming a MOS type FET according to the embodiment of the present invention, which are sectional views of the MOS type FET taken along the line II—II in FIG. 1.

The process sequence will be explained sequentially.

Figure 2A:
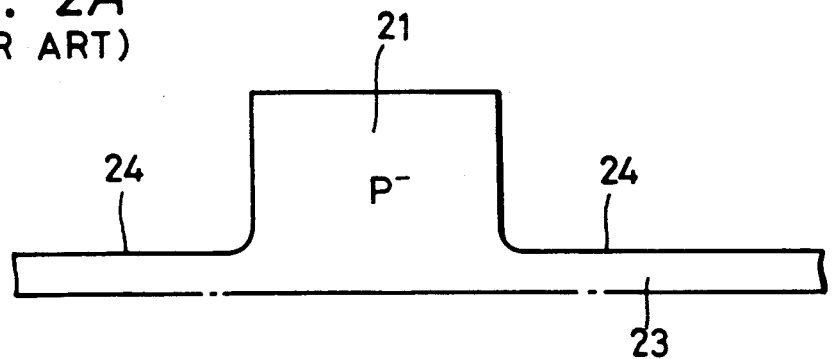
FIGS. 2A to 2E are sectional views showing a process sequence for manufacturing a conventional MOS type FET shown in FIG. 1.
Figure 2B:
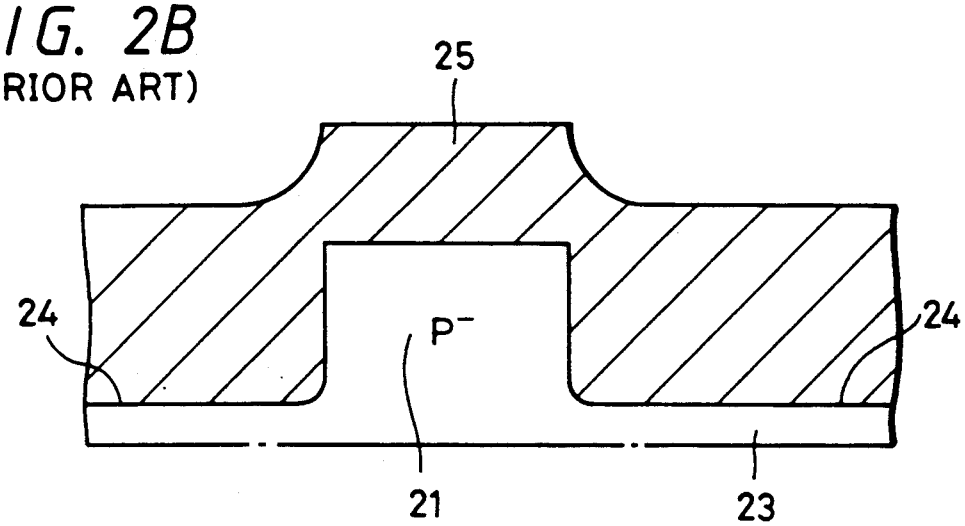
Figure 2C:
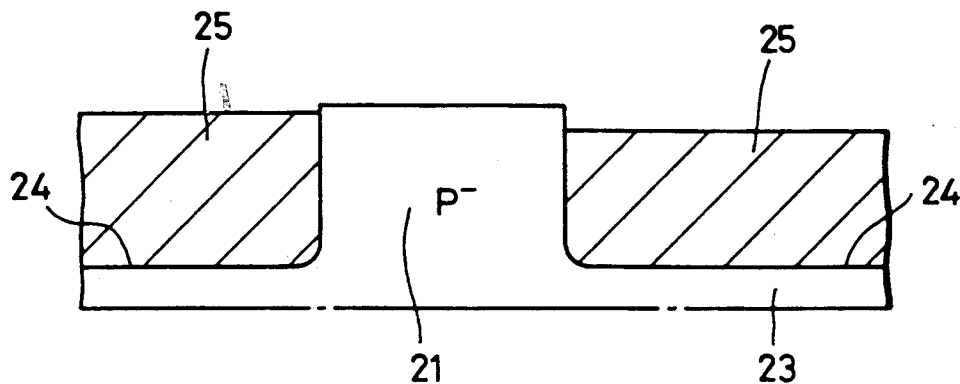
Figure 2D:
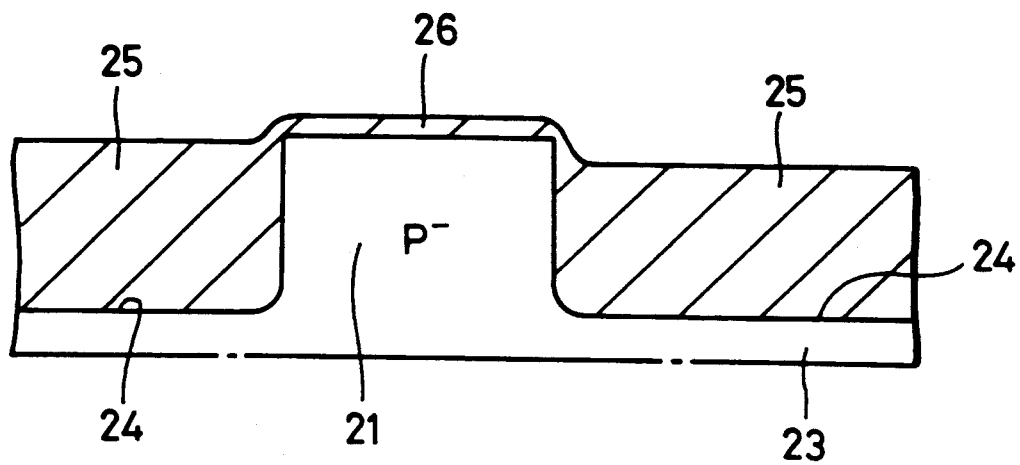
Figure 2E:
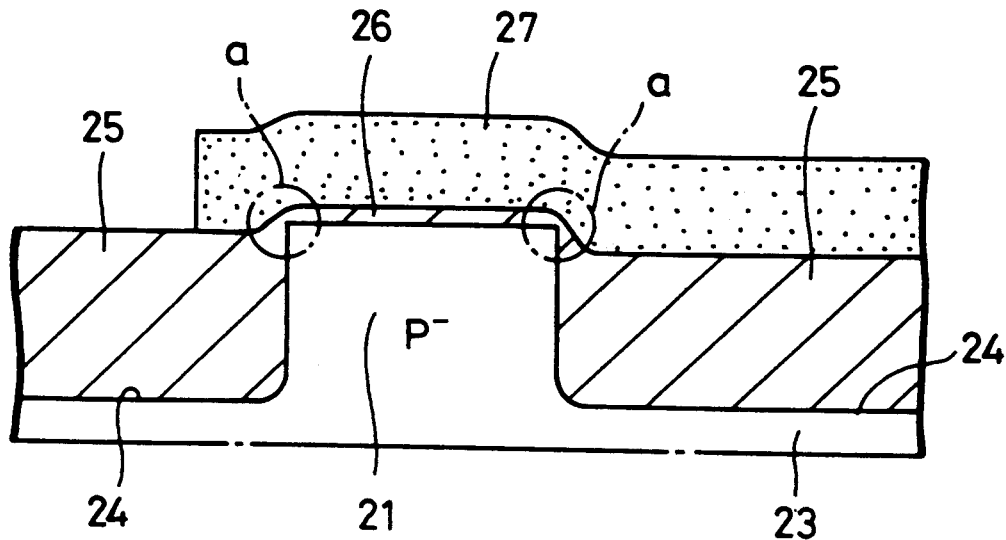
Figure 3A:
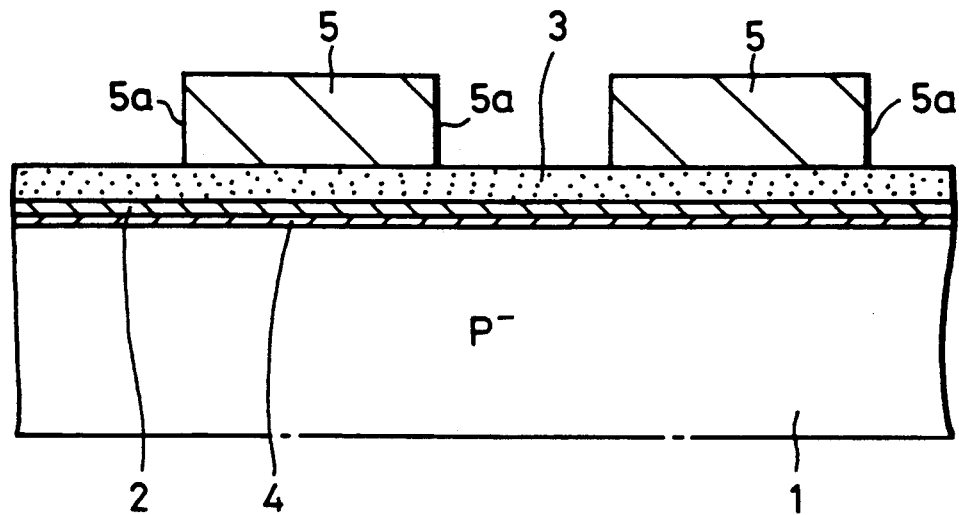
FIGS. 3A to 3F are sectional views showing an embodiment of a process sequence for manufacturing a MOS type FET according to the present invention.

Referring to FIG. 3A, an oxidation proof film such as a $Si_3N_4$ film 2 of several tens to several hundreds nm thickness, about 50 nm thickness in this embodiment, is formed on a substrate such as a p-type silicon substrate 1 by utilizing the CVD technique, for example. This $Si_3N_4$ film 2 may be formed by utilizing the thermal nitrification method technique in place of the CVD technique, for example. Further, an $Si_xO_yN_z$ film may be employed in place of the $Si_3N_4$ film.

Thereafter, a polycrystalline silicon layer 3 of several tens to several hundreds nm thickness, about 100 nm thickness in this embodiment, is formed on the $Si_3N_4$ film 2 by utilizing the CVD technique, for example. A native (natural) oxidation film or thermal oxidation film (hereinafter generally referred to as an oxidation film) 4 of a thickness not more than several tens nm may be formed between the silicon substrate 1 and the $Si_3N_4$ film 2. Then, on the polycrystalline silicon layer 3, a photo resist mask 5 is formed which has openings 5a at portions corresponding to element or device isolation regions.

Figure 3B:
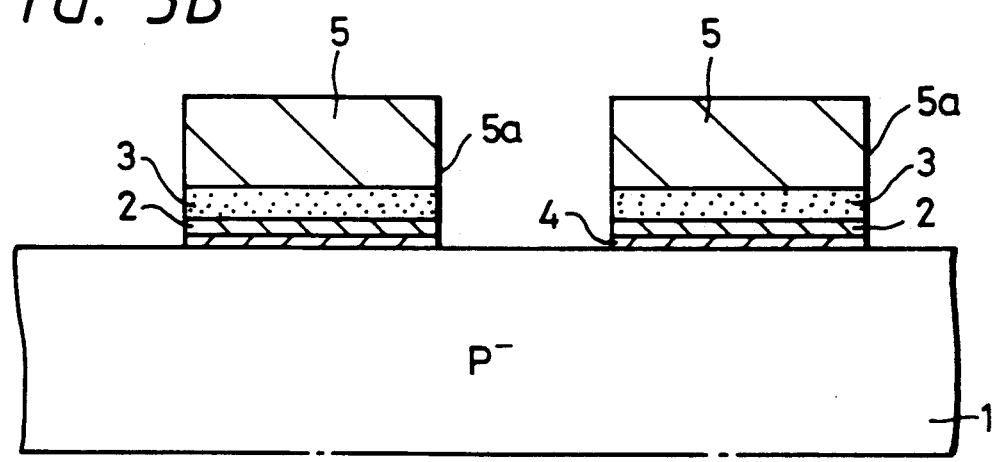

Next, as shown in FIG. 3B, the etching process is carried out to thereby selectively etch away portions of the polycrystalline silicon layer 3 exposed in the openings 5a of the photoresist mask 5, and portions of the $Si_3N_4$ film 2 and oxidation film 4 positioned beneath the portions of the polycrystalline silicon layer 3.

Figure 3C:
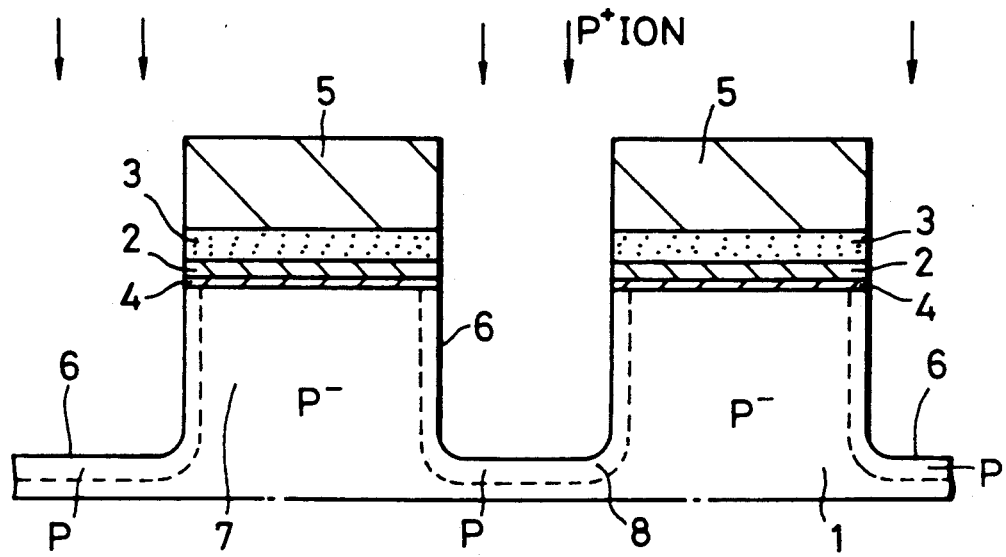

Thereafter, as shown in FIG. 3C, parts of the silicon substrate 1 exposed to the openings 5a are etched away by the RIE technique to thereby form trenches 6. The portions of the silicon substrate 1 other than the trenches 6 form device forming regions 7. Then, an impurity for channel stopper is implanted into the exposed surface of the silicon substrate 1 by the ion implantation technique, thereby forming channel stopper regions 8 along the trenches 6.

Figure 3D:
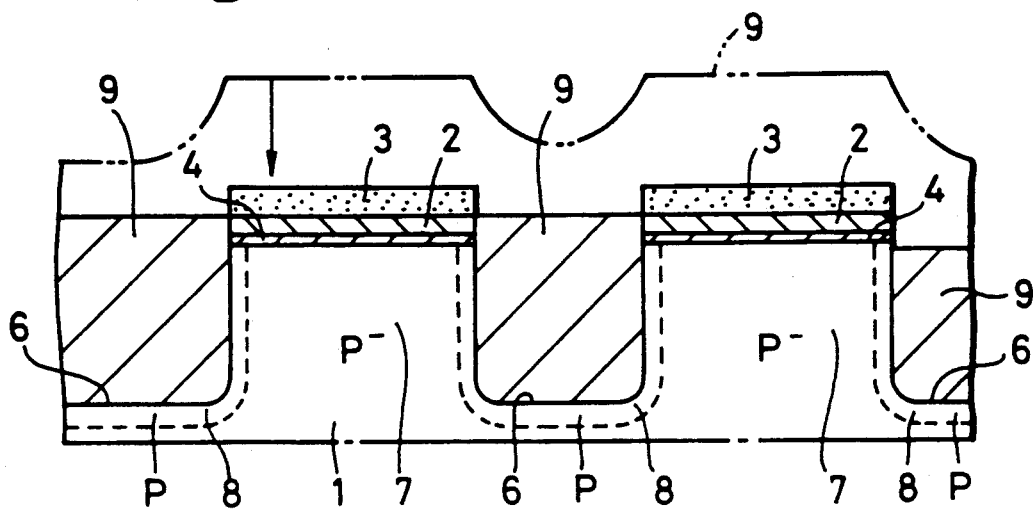

Then, as shown by a two-dot-chain line in FIG. 3D, an insulation film such as an $SiO_2$ film 9 is formed on the entire surface of the silicon substrate 1 and the polycrystalline silicon layer 3 by the bias ECR plasma chemical vapour deposition (CVD) technique Thereafter, the $SiO_2$ film 9 is polished mainly by the etching process, thereby flattening the $SiO_2$ film 9.

In this case, the polycrystalline silicon layer 3 serves as a polishing stopper, so that the polishing process is stopped when the polycrystalline silicon layer 3 is exposed. At this time, the $SiO_2$ film 9 is buried in the trenches 6. In this case, the upper surface of the $SiO_2$ film 9 in some of the trenches 6 may become lower than the upper surface of the device forming region 7 of the silicon substrate 1 due to the scatterings of a polishing rate. The polishing rate between the polycrystalline silicon layer 3 and the $SiO_2$ film 9 can be set large, so that the polycrystalline silicon layer 3 serves as a polishing stopper for flattening and positioning the upper surface of the $SiO_2$ film 9 so as to be substantially the same level as the upper surface of the device forming regions 7 of the silicon substrate 1.

As another technique for flattening the $SiO_2$ film 9, after forming a flattening film such as SOG or BPSG on the entire surface of the $SiO_2$ film 9, the flattening film and the $SiO_2$ film 9 may be etched back by the RIE process, for example, to thereby flatten the $SiO_2$ film 9.

Figure 3E:
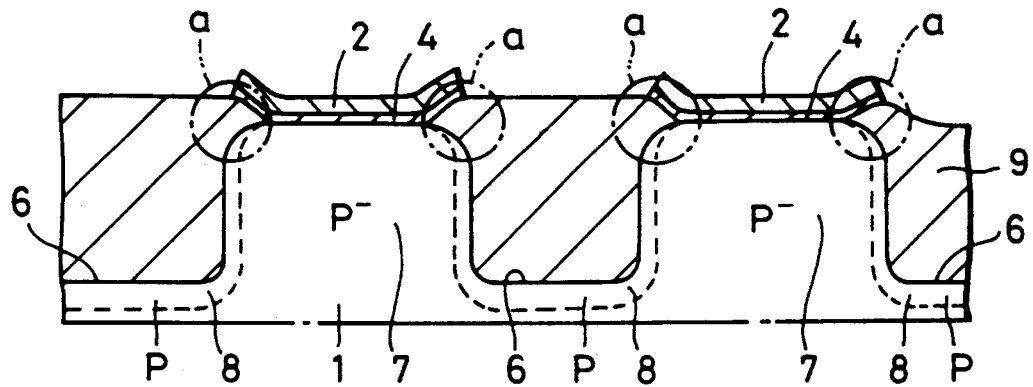

Next, as shown in FIG. 3E, the polycrystalline layer 3 is removed by the dry etching technique utilizing $CF_4$ gas, for example. Then, the $SiO_2$ film 9 in the trenches 6 is grown by about 100nm in thickness by the selective oxidation technique. In this case, bird's beaks due to the selective oxidation appear at the end portions of the $Si_3N_4$ film 2, and so edge portions a of the device forming regions 7 are formed to be round according to the growth of the bird's beaks. Further, since bird's heads grow upwardly according to the growth of the bird's beaks, the thickness of the $SiO_2$ film 9 at least at the edge portions a of the device forming regions 7 becomes larger than that of a gate insulation film 10 formed later.

The selective oxidation technique serves not only as the partial oxidation (rounding process) of the edge portions a of the device forming regions 7 but also as the activation treatment for improving the crystal quality of the channel stopper regions 8, and further as the densification treatment for densifying and stabilizing the $SiO_2$ film 9 buried in the trenches 6.

Figure 3F:
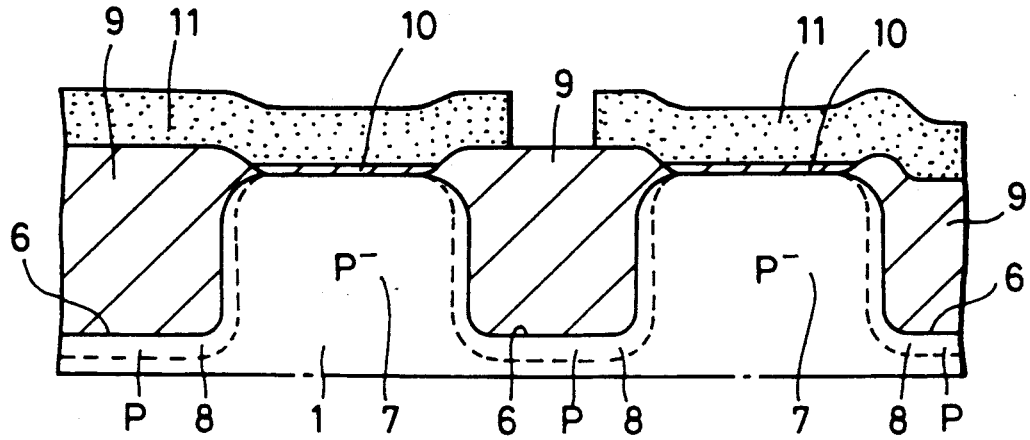

Thereafter, as shown in FIG. 3F, the $Si_3N_4$ film 2 is etched away and then a pre-processing is carried out which also serves as the etching process for removing the oxide film 4 on the device forming regions 7. Then, the thermal oxidation process is carried out to thereby form a gate insulation film 10 of a thermal oxidation film on the device forming regions 7. Thereafter, a polycrystalline silicon layer is formed on the entire surface of both the $SiO_2$ film 9 and the gate insulation film 10, then the patterning process of the polycrystalline silicon layer is carried out to form a gate electrode 11, thereby providing a MOS type FET. In this case, the gate electrode 11 is formed to include the upper surface of the device forming region 7.

As described above, in accordance with the embodiment, the $Si_3N_4$ film 2 and the polycrystalline silicon layer 3 are formed on the silicon substrate 1, then parts of the $Si_3N_4$ film 2, the polycrystalline silicon layer 3 and the silicon substrate 1 are selectively removed to thereby form the trenches 6 in the silicon substrate 1. Thereafter, the $SiO_2$ film 9 is buried in the trenches 6, and then the selective oxidation is carried out on the entire surface of the $SiO_2$ film, so that the edge portions a of the device forming regions 7 of the silicon substrate 1 can be formed to be round. Further, due to the bird's beaks and the bird's heads caused by the selective oxidation, the thickness of the $SiO_2$ film 9 at least at the edge portions a of the device forming regions 7 can be made larger than that of the gate insulation film 10 formed later.

Thus, the thickness of the gate insulation film 10 at the edge portions a of the device forming regions 7 of the silicon substrate 1 can be made sufficiently large after the formation of the gate insulation film 10, whereby the electrostatic concentration at the edge portions a in an operating state of the FET can be reduced and so the breakdown voltage of the gate electrode can be improved.

Further, since the edge portions a of the device forming regions 7 are made round and the thickness of the $SiO_2$ film 9 at the edge portions a of the device forming regions 7 can be made larger, it has become possible to prevent the concentration of stress at the edge portions a during the manufacturing process of the MOS type FET, so that lattice defect at the edge portions a can be decreased. For this reason, the generation of a leakage current can be decreased, thereby improving a yield of the MOS type FET.

While, in the above-described embodiment, the present invention is applied to the MOS type FET, the present invention may also be applied to other MIS devices.

As set out above, according to the manufacturing method of a MIS device of the present invention, it is possible to improve an amount of the breakdown voltage of the MIS device such as a MOS type FET which is isolated by the trench and also to decrease the generation of a leakage current, so that a MIS device such as MOS type FET with high reliability and a good yield can be provided.

Having described the preferred embodiment of the invention with reference to the accompanying drawings, it is to be understood that the invention is not limited to the precise embodiment and that various changes and modifications thereof could be effected by one skilled in the art without departing from the spirit or scope of the novel concepts of the invention as defined in the appended claims.

What is claimed is:

1. A method of manufacturing a metal-insulator-semiconductor (MIS) device in which a gate electrode is formed to cover an upper portion of a device forming region which is isolated by a trench, comprising the steps of:

forming a laminated film including at least an oxidation film on a substrate, an oxidation proof film on said oxidation film, and a polycrystalline silicon film on said oxidation proof film;

selectively removing parts of said laminated film and a part of said substrate beneath said laminated film to thereby form said trench in said substrate;

depositing an insulating film over said substrate and filling said trench;

polishing said insulating film until said polycrystalline silicon layer is exposed;

performing a selective oxidation on the entire exposed surface of said insulating film;

removing said laminated film on said substrate to expose a portion of the surface of the substrate; and oxidizing the exposed portion of the surface of said substrate to form a gate insulating film.

* * * * *